United States Patent [19]

Flödl et al.

[11] Patent Number: 5,131,933
[45] Date of Patent: Jul. 21, 1992

[54] SOLAR CELL

[75] Inventors: Helmut Flödl, Bad Friedrichshall; Paul Uebele, Heilbronn, both of Fed. Rep. of Germany

[73] Assignee: Telefunken Systemtechnik GmbH, Ulm, Fed. Rep. of Germany

[21] Appl. No.: 673,593

[22] Filed: Mar. 22, 1991

[30] Foreign Application Priority Data

Mar. 23, 1990 [DE] Fed. Rep. of Germany ....... 4009336

[51] Int. Cl.$^5$ ...................... H01L 31/06; H01L 31/18
[52] U.S. Cl. ......................................... 136/256; 437/2
[58] Field of Search ..................... 136/256; 437/2-5

[56] References Cited

U.S. PATENT DOCUMENTS

| | | | |
|---|---|---|---|
| 3,982,964 | 9/1976 | Lindmayer et al. | 136/256 |
| 3,988,167 | 10/1976 | Kressel et al. | 136/256 |
| 4,082,570 | 4/1978 | House et al. | 136/246 |
| 4,131,488 | 12/1978 | Lesk et al. | 437/2 |
| 4,336,648 | 6/1982 | Pschunder et al. | 437/4 |
| 4,577,393 | 3/1986 | Schmidt | 437/2 |
| 4,694,117 | 9/1987 | Freidrich et al. | 136/256 |

Primary Examiner—Aaron Weisstuch
Attorney, Agent, or Firm—Spencer, Frank & Schneider

[57] ABSTRACT

A solar cell includes a silicon body with a first anti-reflection layer on its front side. The first anti-reflection layer has elongated window openings which extend parallel to one another. Parallel contact fingers made of metal extend over the first anti-reflection layer at right angles to the window openings. The contact fingers make electrical contact with the silicon body through the window openings. A second anti-reflection layer is deposited on top of the contact fingers and the first anti-reflection layer. The second anti-reflection layer reduces reflection losses at the window openings, in addition to providing further reflection protection where it overlaps the first anti-reflection layer. Highly doped zones can be provided in the silicon body beneath the window openings.

18 Claims, 4 Drawing Sheets

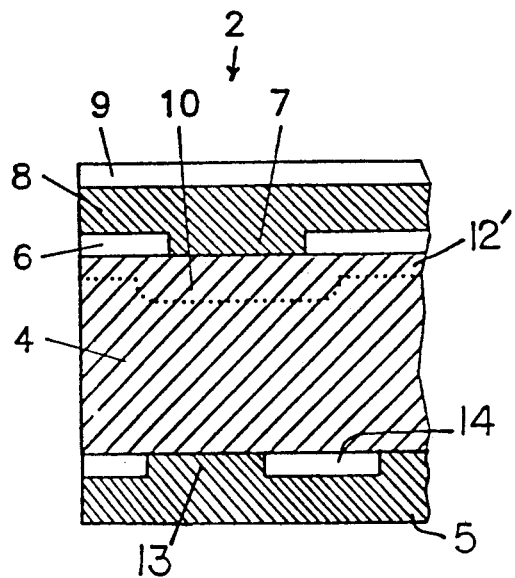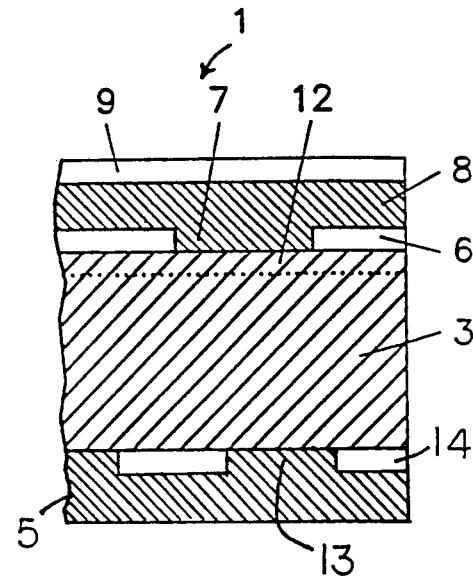
Fig. 1B  Fig. 1A
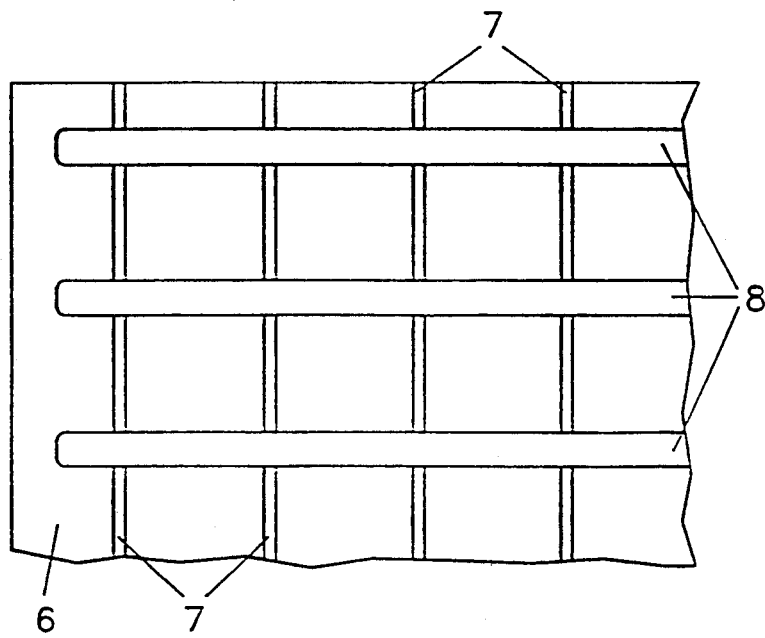
Fig. 2

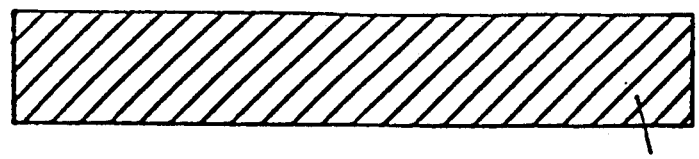
Fig. 4A
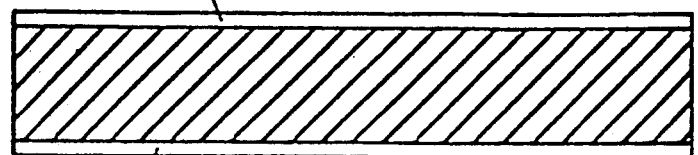
Fig. 4B
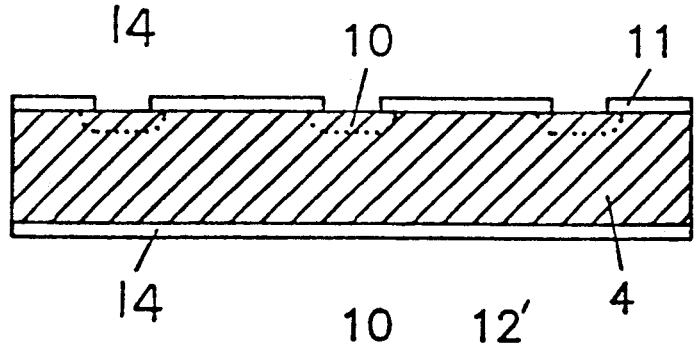
Fig. 4C
Fig. 4D
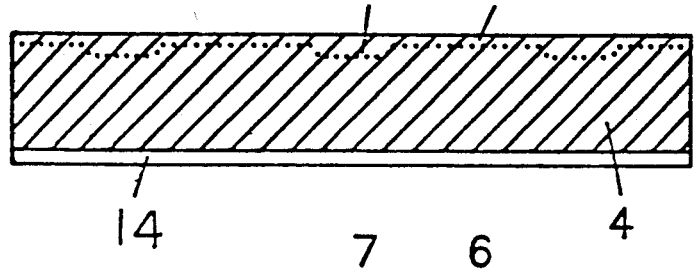
Fig. 4E
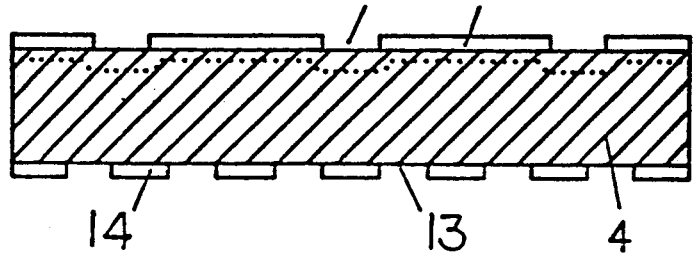
Fig. 4F
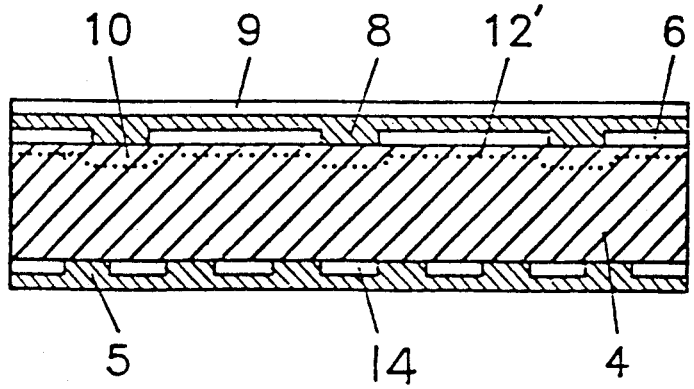

5,131,933

SOLAR CELL

CROSS REFERENCE TO RELATED APPLICATION

This application claims the priority of Application Serial Number P 40 09 336, filed Mar. 23rd, 1990 in Germany, the subject matter of which is incorporated herein by reference.

BACKGROUND OF INVENTION

The present invention relates to a solar cell composed of a semiconductor body having a pn-junction, a rear contact provided on the rear side of the semiconductor body, and a system of contact fingers disposed between first and second anti-reflection layers on the front side of the semiconductor body, which is intended to be exposed to light.

In order to increase the conversion efficiency of silicon solar cells, they are provided with an anti-reflection layer on the side intended to be exposed to the light. This reflection reducing layer is composed of an insulating material and must therefore not cover the front contact provided on the prior art solar cells for their connection with other cells. The thickness of the reflection reducing layer is selected to be such that a reflection minimum occurs at a wavelength of about 600 nm. The layer is a $\lambda/4$ layer and has an index of refraction ranging from 1.4 to 2.5. The anti-reflection reducing layer reduces reflections at the solar cell surface from about 30% to less than 3% for the reflection minimum, so that solar cell efficiency is increased considerably. Two or more matched anti-reflection layers may further improve the reflection behavior.

U.S. Pat. No. 4,336,648 discloses a solar cell in which an anti-reflection layer completely covers the metallization of the front contacts of the solar cell. The electrical connection with these front contacts is effected by ultrasonic welding, with the reflection reducing layer disposed between the contact locations being locally removed during the welding process.

U.S. Pat. No. 4,694,117 discloses a solar cell in which a rear contact is disposed on a semiconductor body having a pn-junction. On the side that is intended to be exposed to the light, the semiconductor body is provided with a reflection reducing layer. At least one front contact is applied directly to an insulating layer so that the charge carriers travel from the semiconductor body to the front contact by tunneling through the insulating layer. The insulating layer simultaneously constitutes the reflection reducing $\lambda/4$ layer and may be composed of $TiO_x$ with a thickness of about 70 nm.

The front contact may be disposed above an additional ohmic metal terminal disposed underneath the reflection reducing layer and contacting the surface of the semiconductor body. The front contact may be composed of conductive adhesives, glued-on conductor paths, or glued-on wires.

Solar cells equipped with conductive anti-reflection layers on which the front contact fingers are disposed are also known. For example, U.S. Pat. No. 4,577,393 discloses a method of producing such a solar cell in which the pn-junction is produced by the diffusion of impurities from a doping layer. A first layer serving as a diffusion source for producing of the pn-junction and for doping the anti-reflection layer is applied to the semiconductor body. A second layer for producing the anti-reflection layer is then applied onto the first layer. A tempering process takes place in which the pn-junction is produced, an anti-reflection layer is formed of the two layers, and the anti-reflection layer is doped so that it becomes suitably conductive.

SUMMARY OF THE INVENTION

It is an object of the present invention to provide a solar cell of the above-mentioned type in which a local ohmic connection is provided between the contact fingers and busbars of the contact system and the emitter layer of the semiconductor body.

This is accomplished according to the invention in that the first anti-reflection layer, which is disposed on the emitter layer of the semiconductor body, is provided with window openings in the form of fine line structures which extend transversely to the contact fingers, and in that the contact fingers engage regions of the window openings in such a way that local ohmic contacts are made between the contact fingers and the emitter layer of the semiconductor body. Preferably, in one embodiment of the invention, the window lines and the contact fingers are disposed at an angle of about 90°. According to the invention, the window lines may extend from one edge of the cell to the opposite edge of the cell, or they may be interrupted between the contact fingers. Preferably, the window lines are produced by etching by way of a photolacquer process and have a width of 0.01 mm to 0.03 mm.

Due to the first anti-reflection layer, for example an insulating silicon nitride layer, the contact surface between the metallization and the emitter layer is reduced considerably, so that surface recombination of the minority charge carriers can be greatly reduced. This improves the electrical characteristics of the solar cell, particularly the open-circuit voltage and the short-circuit current.

A significant advantage of a solar cell having the first anti-reflection layer is that adjustment of the contact fingers with regard to the window openings is not required.

Another advantage is that, according to a modification of the invention, a second anti-reflection layer can be used to reduce reflections at the emitter layer of the semiconductor body under the window openings.

Another feature of the invention resides in that the semiconductor body can be provided with linear, highly doped zones which are disposed centrally with regard to the line-shaped window openings.

BRIEF DESCRIPTION OF THE DRAWINGS

FIGS. 1A and 1B are cross-sectional views showing portions of two solar cells in accordance with the present invention.

FIG. 2 is a schematic top plan view showing the positions of the contact fingers relative to window openings in a first anti-reflection layer.

FIG. 4A–4F are sectional views used for explaining the manufacturing procedures for making a solar cell (specifically, the solar cell of FIG. 1B) with screen-printed contact fingers.

DESCRIPTION OF THE PREFERRED EMBODIMENTS

Figure 2A:
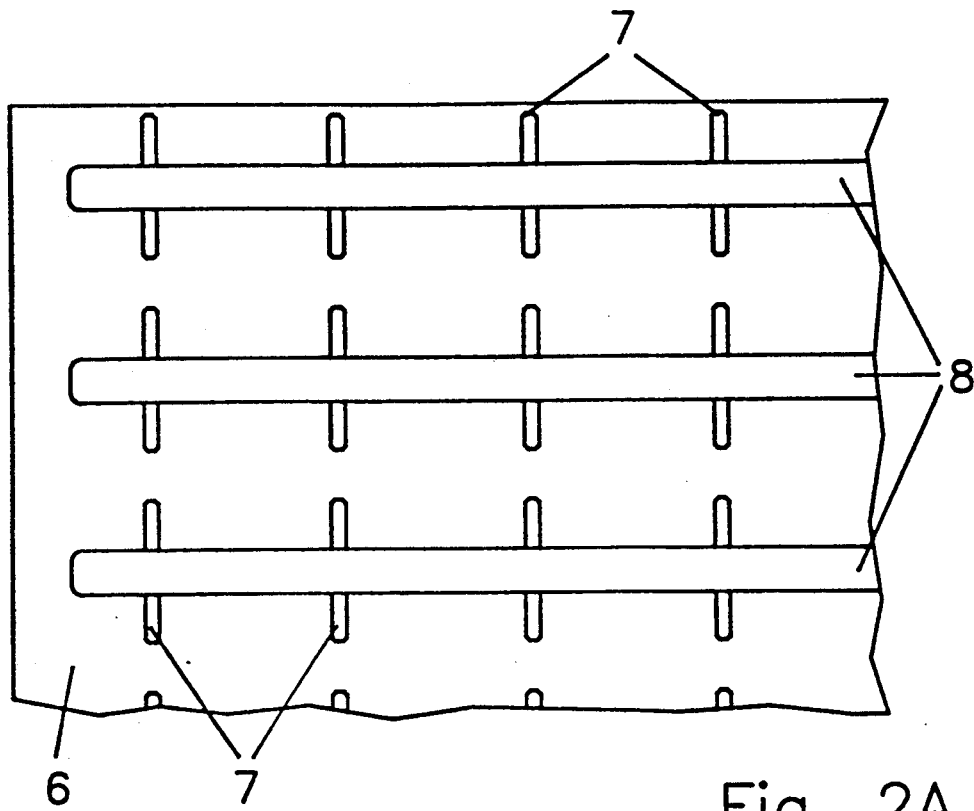
FIGS. 2A and 2B are schematic top plan views showing the positions of the contact fingers relative to window openings wherein the window openings are interrupted.
Figure 2B:
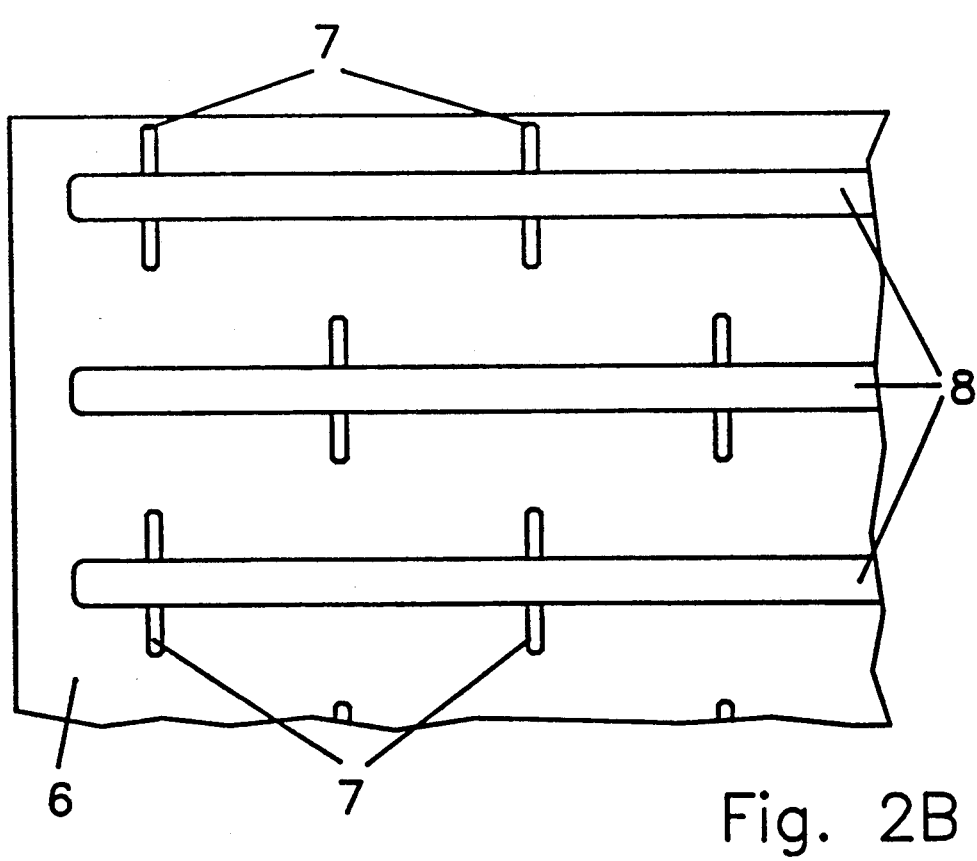

In FIG. 1A, solar cell 1 includes a p-type semiconductor body 3 with an n-type emitter layer 12, thereby providing a pn-junction as shown by the dotted line. Body 3 is preferably a silicon semiconductor body. A first anti-reflection layer 6, for example a silicon nitride coating, is applied to the emitter layer 12 by plasma supported chemical vapor-deposition (CVD) precipitation. This first anti-reflection layer has window openings 7 which are configured as a line structure and can be produced photolithographically, by means of a screen-printing mask or by laser. Window openings 7 may, for example, have a width of 30 μm, with the spacing between two parallel window openings 7 possibly being approximately 1 mm. Contact fingers 8 of a contact finger system are applied on the first anti reflection layer 6, for example by vapor-deposition. Contact fingers 8 extend transversely to window openings 7, preferably at an angle of 90° (see FIGS. 2, 2A, 2B) and engage into regions of window openings 7 in such a way that approximately dot-shaped ohmic connections exist between contact fingers 8 and the emitter layer 12. A second anti-reflection layer 9 is applied to the contact finger system, preferably an $Al_2O_3$ layer. This second anti reflection layer 9 also covers the emitter layer 12 of semiconductor 3 body in the regions of window openings 7 which are not covered by contact fingers 8. A rear contact 5 extends through window openings 13 in an insulating layer 14 to provide an electrical connection with the rear side of semiconductor body 3. Layer 14 may be made of the same material as anti-reflection layer 6 and could be removed before contact 5 is applied.

A slightly modified embodiment of the invention is shown in FIG. 1B. Solar cell 2 includes a p-type semiconductor body 4 with an n-type emitter layer 12' at its front side. Emitter layer 12' has highly doped zones 10 at the window openings 7, and as a result the pn-junction protrudes downward in these regions as shown by the dotted line. Otherwise, solar cell 2 has the same configuration as solar cell 1.

The two solar cells 1 and 2 differ from one another essentially in their manufacturing process, with the manufacturing process for solar cell 1 being shown in FIGS. 3A–3E and that for solar cell 2 being shown in FIGS. 4A–4F. These Figures show the individual process steps for the application of the contact finger systems on the front side as well as the contact on the rear side of semiconductor bodies 3 and 4.

Figure 3A:
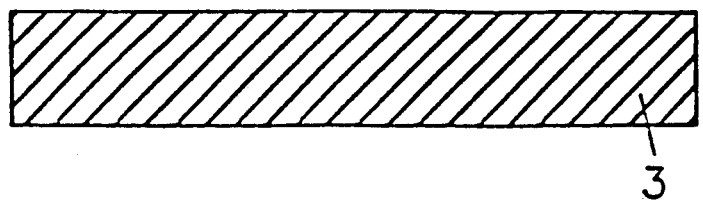
FIGS. 3A–3E are sectional views used for explaining the manufacturing process for making a solar cell (specifically, the solar cell of FIG. 1A) having vapor-deposited contact fingers.
Figure 3B:
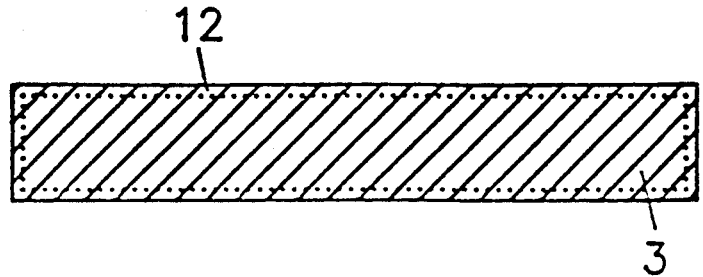
Figure 3C:
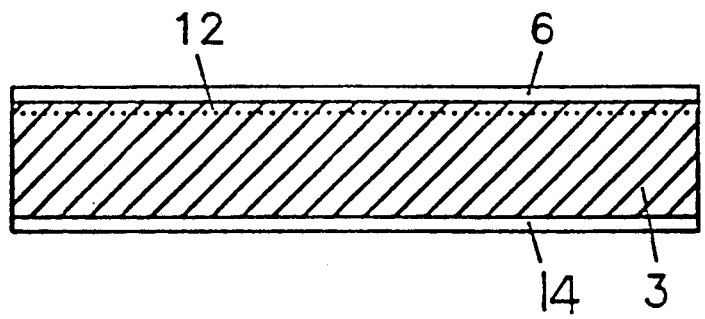
Figure 3D:
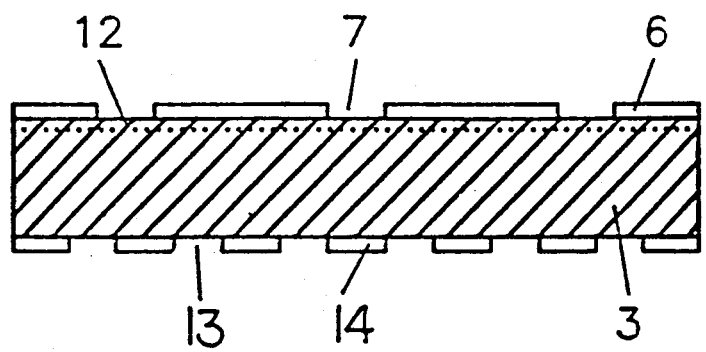

During the manufacture of solar cell 1, a semiconductor body 3 as shown in FIG. 3A is initially subjected to a cleaning process. In FIG. 3B, a flat diffusion process using phosphorus as the dopant provides the pn-junction. The rear side and the edges of body 3 are etched with a silicon etchant to remove the doped layer in these regions, leaving only the emitter layer 12. The anti-reflection layer 6 is then formed on the front side of semiconductor body 3 by using a plasma process to apply silicon nitride, as shown in FIG. 3C. During this process the layer 14 (also silicon nitride) is formed on the rear side. Thereafter, the linear window openings 7 and 13 are produced, using photolacquer and a photolithography process, for example. This is shown in FIG. 3D. Thereafter, a metal vapor-deposition process is used to deposit the rear contact 5 and the contact fingers 8 of the front contact finger system. Finally, as shown in FIG. 3D, the second anti-reflection layer 9 is applied e.g. a plasma process.

Figure 3E:
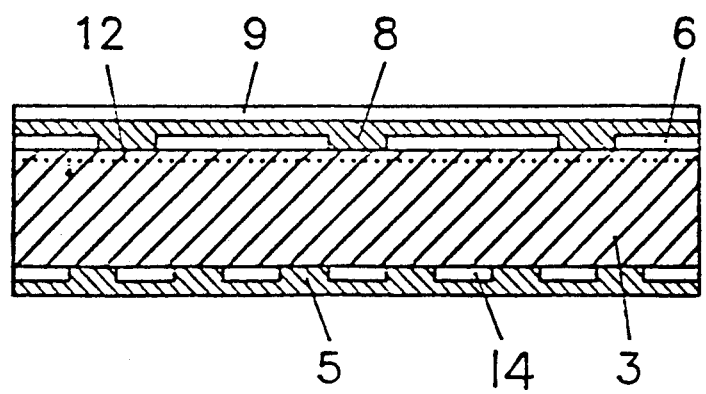

For the manufacture of solar cell 2, three additional process steps are added after the semiconductor body 4 as shown in FIG. 4A has been cleaned. In FIG. 4B, an $SiO_2$ diffusion mask layer 11 is formed on the front side and the layer 14 (also of silicon dioxide) is simultaneously formed on the rear side. A line structure is then etched on the front side of the cell to provide openings in the mask layer 11 for a locally deep diffusion using phosphorus as a dopant so as to produce linear, highly doped zones lo in semi-conductor body 4, as shown in FIG. 4C. After an $SiO_2$ etching process on the front side of semiconductor body 4 to remove the layer 11, a diffusion process is employed again to complete the emitter layer 12, as shown in FIG. 4D. Thereafter, the coating process to apply the first anti-reflection layer 6 takes place. Then the same process steps take place in FIGS. 4E and 4F as are shown in FIGS. 3D and 3E for the production of solar cell 1, with the particularity that the linear window openings 7 are arranged in the center of the highly dopes zones 10. It is noted that the metallization that provides the electrical contacts 8 and 15 may be by screen-printing.

It will be understood that the above description of the present invention is susceptible to various modifications, changes, and adaptations, and the same are intended to be comprehended within the meaning and range of equivalents of the appended claims.

What we claim is:

1. A solar cell, comprising:
   a semiconductor body having front and rear sides and having an emitter layer at its front side, the semiconductor body additionally having a pn-junction between its front and rear sides;
   a rear contact at the rear side of the semiconductor body;
   a first anti-reflection layer disposed at the front side of the semiconductor body on the emitter layer, the first anti-reflection layer having window openings in the form of fine line structures;
   a second anti-reflection layer disposed on the first anti-reflection layer; and
   a contact finger system between the first and second anti-reflection layers, the contact finger system including contact fingers which extend transverse to the window openings and which make localized ohmic contact with the emitter layer through the window openings.

2. The solar cell of claim 1, wherein the contact fingers are disposed at an angle of about 90° with respect to the window openings.

3. The solar cell of claim 1, wherein the semiconductor body has first and second spaced-apart edges, and wherein the window openings extend from respective positions adjacent the first edge to respective positions adjacent the second edge.

4. The solar cell of claim 1, wherein the window openings are interrupted between the contact fingers.

5. The solar cell of claim 1, wherein the window openings have a width in the range of about 0.01 mm to about 0.03 mm.

6. The solar cell of claim 1, wherein portions of the window openings are covered by the contact fingers and other portions of the window openings are not covered by the contact fingers, and wherein the second anti-reflection layer covers the contact fingers and the portions of the window openings not covered by the contact fingers.

7. The solar cell of claim 1, wherein the semiconductor body has linear, highly doped zones which lie beneath the centers of the window openings.

8. A solar cell, comprising:
a semiconductor body having front and rear sides and having an emitter layer at its front side, the semiconductor body additionally having a pn-junction between its front and rear sides;
a first anti-reflection layer disposed at the front side of the semiconductor body on the emitter layer, the first anti-reflection layer having window openings which are disposed in spaced-apart rows;
a second anti-reflection layer disposed on the first anti-flection layer; and
a contact finger system between the first and second anti-reflection layers, the contact finger system including contact fingers which extend transverse to the rows and which protrude through the window openings to contact the emitter layer through the window openings.

9. The solar cell of claim 9, wherein the first anti-flection layer has a single, continuous window opening per row.

10. The solar cell of claim 8, further comprising a layer of insulating material contacting the rear side of the semiconductor body, the layer of insulating material having window openings therein through which the rear contact touches the rear side of the semiconductor body.

11. The solar cell of claim 10, wherein the layer of insulating material is made of the same material as the first anti-reflection layer.

12. The solar cell of claim 10, wherein the layer of insulating material is made out of $SiO_2$.

13. The solar cell of claim 10, wherein the rear contact is a single contact which is spaced-apart from the rear side of the semiconductor body by the insulating layer except a the window openings in the insulating layer.

14. The solar cell of claim 8, wherein portions of the window openings are covered by the contact fingers and other portions of the window openings are not covered by the contact fingers, and wherein the second anti-reflection layer covers the contact fingers and the portions of the window openings not covered by the contact fingers.

15. The solar cell of claim 8, wherein the first anti-reflection layer has a plurality of spaced-apart window openings per row.

16. A method for making a solar cell from a semiconductor body having front and rear sides and having an emitter layer at is front side, the semiconductor body additionally having a pn-junction between its front and rear sides, said method comprising the steps of:
disposing a rear contact at the rear side of the semiconductor body;
disposing a first anti-reflection layer at the front side of the semiconductor body on the emitter layer, the first anti-reflection layer having window openings in the form of fine line structures;
disposing a second anti-reflection layer on the first anti-reflection layer; and
providing a contact finger system between the first and second anti-reflection layers, the contact finger system including contact fingers which extend transverse to the window openings and which protrude through the window openings to make localized ohmic contact with the emitter layer.

17. The method of claim 16, wherein the step of disposing a first anti-reflection layer at the front side of the semiconductor body on the emitter layer is conducted by etching using a photolacquer process.

18. The method of claim 16, wherein portions of the window openings are covered by the contact fingers and other portions of the window openings are not covered by the contact fingers, and wherein the step of disposing a second anti-reflection layer on the first anti-reflection layer further comprises covering the contact fingers and the portions of the window openings not covered by the contact fingers with the second anti-reflection layer.

* * * * *